United States Patent [19]

Patterson et al.

[11] Patent Number: 4,814,757
[45] Date of Patent: Mar. 21, 1989

[54] ELECTRICAL, SCROLLING DIGIT DISPLAY

[75] Inventors: G. Richard Patterson, Doylestown; Jon W. Trauger, Sellersville, both of Pa.

[73] Assignee: Ametek, Inc., New York, N.Y.

[21] Appl. No.: 62,190

[22] Filed: Jun. 11, 1987

[51] Int. Cl.⁴ .............................................. G09G 3/00
[52] U.S. Cl. .................................. 340/753; 340/754; 340/752
[58] Field of Search ............... 340/752, 753, 754, 791, 340/792, 723, 347 AD, 782, 783; 324/121 R, 122; 73/182

[56] References Cited

U.S. PATENT DOCUMENTS

| | | |
|---|---|---|
| 3,132,338 | 5/1964 | Schmid . |
| 3,275,871 | 9/1966 | Yiotis . |
| 3,343,155 | 9/1967 | Pahlavan . |
| 3,383,594 | 5/1968 | Fiorletta et al. . |
| 3,460,127 | 8/1969 | Pahlavan . |
| 3,594,757 | 7/1971 | Gard . |
| 3,714,569 | 1/1973 | Bruning, Jr. et al. . |
| 3,726,250 | 4/1973 | Merk ................... 340/754 |
| 3,754,121 | 8/1973 | Delay et al. ........... 340/753 |
| 3,914,758 | 10/1975 | Ingle . |
| 3,938,139 | 2/1976 | Day ...................... 340/792 |
| 4,155,084 | 5/1979 | Klees . |
| 4,176,546 | 12/1979 | Gibson et al. . |
| 4,194,197 | 3/1989 | Bodin ................... 340/792 |
| 4,232,312 | 11/1980 | Eccles et al. . |
| 4,240,074 | 12/1980 | Gibson et al. ......... 340/753 |
| 4,415,974 | 11/1983 | Laug et al. ............ 340/753 |
| 4,570,151 | 2/1986 | Martorano et al. . |
| 4,581,612 | 4/1986 | Jones . |
| 4,636,782 | 1/1987 | Nakamura ............. 340/753 |

Primary Examiner—John W. Caldwell, Sr.
Assistant Examiner—Alvin Oberley
Attorney, Agent, or Firm—Amster, Rothstein & Ebenstein

[57] ABSTRACT

An electrical display and method in which the least significant digit is moved or scrolled in mechanical counter fashion are disclosed. Only the least significant digit is scrolled, and the more significant digits change instantaneously when an adjacent less significant digit changes between its highest and lowest values, unlike mechanical counters. The disclosed display and method include a rounding-off feature according to which the least significant digit is rounded off when the input signal variable is unchanging and displayed in alignment with the display of the more significant digits.

23 Claims, 15 Drawing Sheets

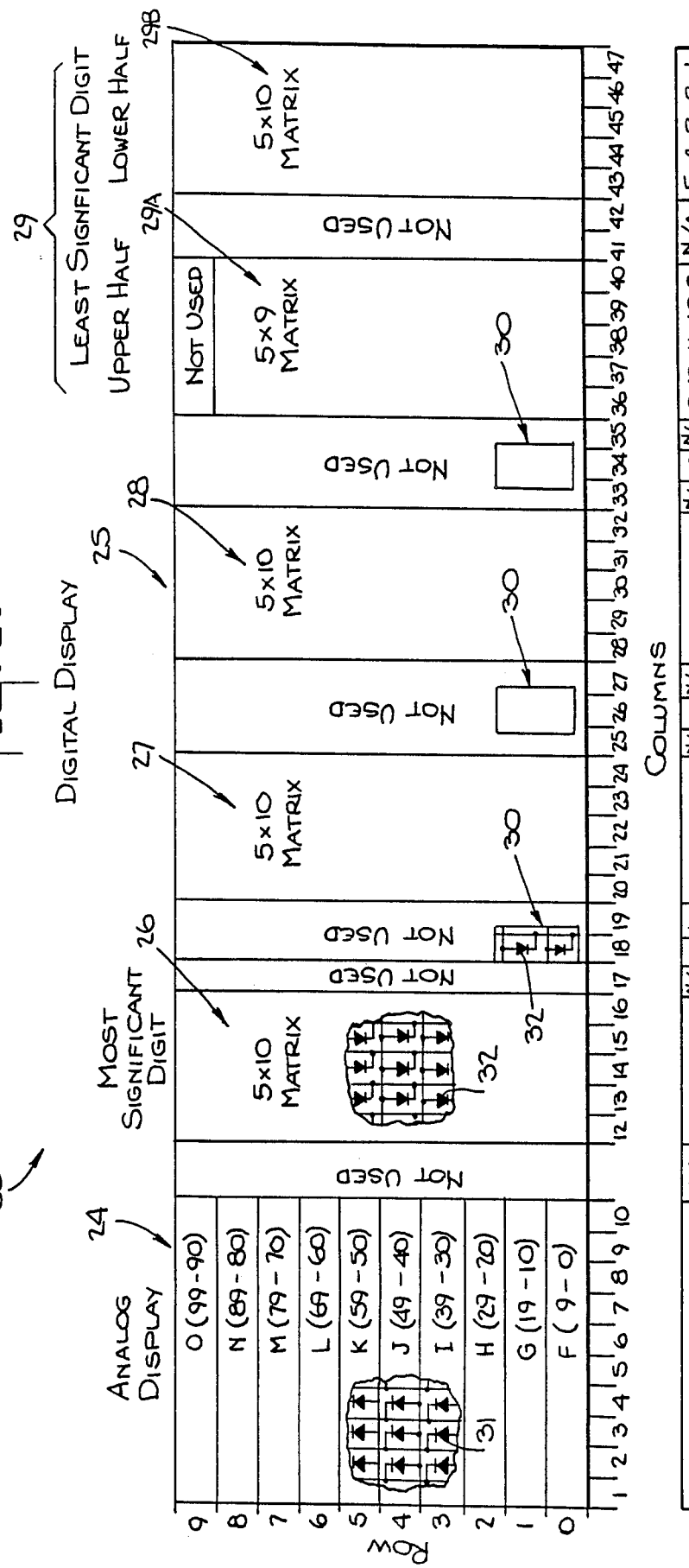

Fig. 16.

ELECTRICAL, SCROLLING DIGIT DISPLAY

BACKGROUND OF THE INVENTION

The invention disclosed herein relates to an electrical digital display which incorporates some, but not all, of the moving (scrolling) digit features of a mechanical drum-type counter.

Electrical digital displays in which the digit values being displayed change instantaneously with changes in a parameter of an input signal are well known in the art. Such displays have the disadvantage of being unreadable when the input signal parameter being displayed changes rapidly, i.e., the digit values, particularly the least significant digit, change so quickly, or "wink", that the display is unreadable at an appropriate sampling rate. The display ma be made readable by decreasing the sampling rate, but that may result in inaccurate display readings. Another disadvantage of such displays is that they are incapable of indicating trends, in contrast to analog displays such as meters and mechanical drum-type counters.

U.S. Pat. Nos. 3,132,338 (Schmid) and 3,714,569 (Bruning, Jr. et al.) disclose electrical displays which include a digital display portion and an analog display portion. The least significant digit is displayed in the analog display portion and the more significant digits in the digital display portion. The analog display portion of those displays comprises a conventional, e.q., moving-coil, meter and the digital display portion comprises gas discharge. e.g. Nixie, tubes. The analog portion includes a pointer or scale which moves with input signal parameter change rather than changing instantaneously, and the more significant digits in the digital portion of the display change instantaneously when the least significant digit changes between its highest and lowest values. Thus, display of the least significant digit does not wink and the display is capable of indicating trends.

U.S. Pat. No. 3,914,758 (Ingle) discloses a display which is capable of indicating trends in the least significant digit and which utilizes gas discharge tubes for displaying each of the digits of the input signal parameter. Two gas discharge tubes digitally display the more significant digits conventionally, i.e., they change the displayed value instantaneously when the adjacent less significant digit changes between its highest and lowest values. Although the least significant digit is also displayed by a gas discharge tube, it is not displayed as a number or digit. Instead, selected elements of the least significant digit gas discharge tube are illuminated in accordance with a code to represent the instantaneous value of the least significant digit. In addition, the intensity of illumination of the selected elements is proportional to the time that the least significant digit has the value represented by the illuminated element(s). Thus, a visual indication of trends in the value of the least significant digit is represented by the relative brightness of the individual elements of the least significant digit gas discharge tube. However, one must know the code to be able to read the value of least significant digit.

While those displays at least partly avoided the winking disadvantage of fully digital electric displays and were capable of indicating trends, they are not suitable for certain applications such as aircraft instruments.

U.S. Pat. No. 3,383,594 (Fiorletta et al.) discloses a cathode ray tube (CRT) display of a single digit in which the single displayed digit is scrolled with input signal variable change. That display also is capable of indicating trends in changes of the input signal variable.

Electrical digital displays which duplicate features of mechanical drum-type counters using electrical and electrooptical components are disclosed, for example, in U.S. Pat. Nos. 4,570,151 (Martorano et al.), 4,240,074 (Gibson et al.), and 4,581,612 (Jones). In the displays disclosed in those Patents, display of the least significant digit is displaced or scrolled in accordance with changes in the input signal parameter. In addition to scrolling the least significant digit, the displays of those Patents also scroll a more significant digit in synchronism with an adjacent less significant digit when the adjacent less significant digit changes between its highest and lowest values. Such displays are intended to fully duplicate the display features of mechanical drum-type counters and may be used as aircraft instruments and automobile odometers. However, in duplicating the moving digit features of mechanical counters, they also incorporate certain disadvantages of mechanical counters.

One disadvantage of mechanical drum-type counters and their electrical counterparts is that they are unreadable at certain transition points where a number of the digits is changing. For example, in a four digit counter or display, the transition between 1999 and 2000 at approximately 1999.5 is unreadable. Another disadvantage of such counters and displays is that the least significant digit is frequently not readable when it is at a transition point and not aligned with the more significant digits. A display including scrolling of the least significant digit combined with instantaneous changing of the more significant digits, as taught, for example, by combining the Fiorletta et al., Schmid, Bruning, Jr. et al. and Ingle Patents, would eliminate the one disadvantage referred to above but not the other.

U.S. Pat. Nos. 3,275,871 (Yiotis), 4,155,084 (Klees) and 4,232,312 (Eccles et al.) disclose electrical displays which indicate an input signal parameter value in analog form, for example, as a pointer or bar graph. U.S. Pat. Nos. 3,343,155 (Pahlavon), 3,460,127 (Pahlavon), and 3,594,757 (Gard) disclose electrical displays duplicating mechanical moving tape indicators. U.S. Pat. No. 4,176,546 (Gibson et al.) discloses a mechanical display having a meter portion and a drum-type counter portion which provide both a digital and an analog readout of an input signal parameter.

The electrical display and method of displaying disclosed herein overcome the disadvantages described above of mechanical drum-type counters and their electrical counterparts, as well as other disadvantages of mechanical counters.

OBJECTS AND SUMMARY OF THE INVENTION

It is an object of the present invention to provide a plural-digit display and method of displaying a plural-digit number which avoid the disadvantages described above.

It is another object of the present invention to provide a plural-digit display and method of displaying a plural-digit number which incorporate certain advantages of the scrolling or moving digit feature of a mechanical drum-type counter and yet provide a more readable display.

According to the invention, a display and a method for displaying a plural-digit number are provided in which: the display of a less significant digit is moved or scrolled in accordance with changes in the value of an input signal parameter; the display of a more significant digit of the plural digit number is maintained stationary during movement of the display of the less significant digit except when the display of the less significant digit is moved between its highest and lowest values at which time the value of the more significant digit is changed instantaneously; and the value of the less significant digit is rounded off when the input parameter is unchanging and the rounded-off value displayed in alignment with the display of the more significant digit.

A display according to the invention includes a digital display portion for digitally displaying the plural digit number as described above, and may also include an analog display portion such that the display displays the plural digit number simultaneously in digital and analog form. According to specific embodiments of the invention, the analog portion of the display displays the plural digit number in either bar graph fashion, e.q. in a curved or linearly-extending bar graph, or in meter fashion, i.e., by means of a pointer and a scale, e.g. a curved or linearly-extending scale.

In a specific embodiment, the less significant digit is displayed in a first display area and the more significant digit is displayed in a second display area, and the first and second display areas are disposed in a side-by-side relationship to display two adjacent digits of the plural digit number. In another embodiment, the display areas may be disposed end to end, i.e., one above the other, rather than side by side.

The display includes energizing means for receiving the input signal and for selectively energizing the first and second display areas to cause the first and second display areas together to display the plural digit number, the value of which is related to the received input signal parameter. The energizing means causes the first display area to move the display of the less significant digit in the first display area in accordance with changes in the received input signal parameter and to cause the display to instantaneously change the display of the more significant digit in the second display area when the display of the less significant digit changes between its highest and lowest values. The energizing means also rounds off the value of the less significant digit of the plural digit number when the received input signal parameter is unchanging and causes the rounded-off value of the less significant digit to be displayed in the first digital display area in alignment with the digit value displayed in the second display area.

Preferably, the first display area is larger than the second display area in the direction of movement therein of the displayed less significant digit and is energizable to display one value of the less significant digit of the plural digit number and at the same time adjacent thereto at least a part of an adjacent value of the less significant digit. Preferably, the energizing means after rounding off the value of the less significant digit causes the part or parts of an adjacent value or values of the less significant digit to be displayed in the first display area together with the aligned, rounded-off value of the less significant digit. Alternatively, after rounding off, only the rounded-off value of the less significant digit is displayed in the larger display area in alignment with the display of the more significant digit.

In an alternate embodiment, the first and second display areas each are of a size capable of fully displaying only one value of the respective digit to be displayed in each display area, and after the less significant digit is rounded off, only the rounded-off value is displayed in the first display area aligned with the digit value displayed in the second display area.

According to a preferred embodiment, the first display area displays the least significant digit of the plural digit number and the second display area displays the adjacent more significant digit.

The first and second display areas of the display device may comprise any display or displays capable of achieving the foregoing operation. In a preferred embodiment, at least the first display area comprises a matrix of energizable elements. For example, the first display area may comprise light-emitting diode (LED), electro luminescence, liquid crystal, plasma gas discharge, and/or vacuum florescence elements, as well as other types of elements.

According to the method of the invention, a plural digit number is displayed on a display device of the type described above by: selectively energizing the display areas in response to an input signal to cause the display areas together to display a value of the plural digit number related to a parameter of an input signal; moving the display of a less significant digit of the plural digit number in a first display area in accordance with changes in the received input signal parameter; instantaneously changing the display of a more significant digit of the plural digit number in a second display area when the display of the less significant digit changes between its highest and lowest values; rounding off the value of the less significant digit of the plural digit number when the received input signal parameter is unchanging; and displaying the rounded-off value of the less significant digit in the first display area in alignment with the display of the more significant digit.

The above and other objects, advantages, aspects and features of the invention will be more readily perceived from the following description of the preferred embodiments thereof taken with the accompanying drawings and appended claims.

BRIEF DESCRIPTION OF THE DRAWINGS

The present invention is illustrated by way of example and not limitation in the figures of the accompanying drawings in which like references indicate similar parts, and in which:

FIG. 8 is a block diagram illustrating an embodiment of the display according to the invention which schematically depicts the display device of FIG. 1 and energizing means therefor;

FIG. 9 is a diagram illustrating an LED matrix array which forms the digital display and analog display portions of the display device depicted in FIG. 1, and also depicting the format of the digital signal which selectively energizes the LED matrix array;

FIG. 16 is a diagram illustrating data storage in a portion of a read only memory in the display of FIG. 8 which stores data relating to the formation of digits on the display device.

DESCRIPTION OF THE PREFERRED EMBODIMENTS

Figure 1:
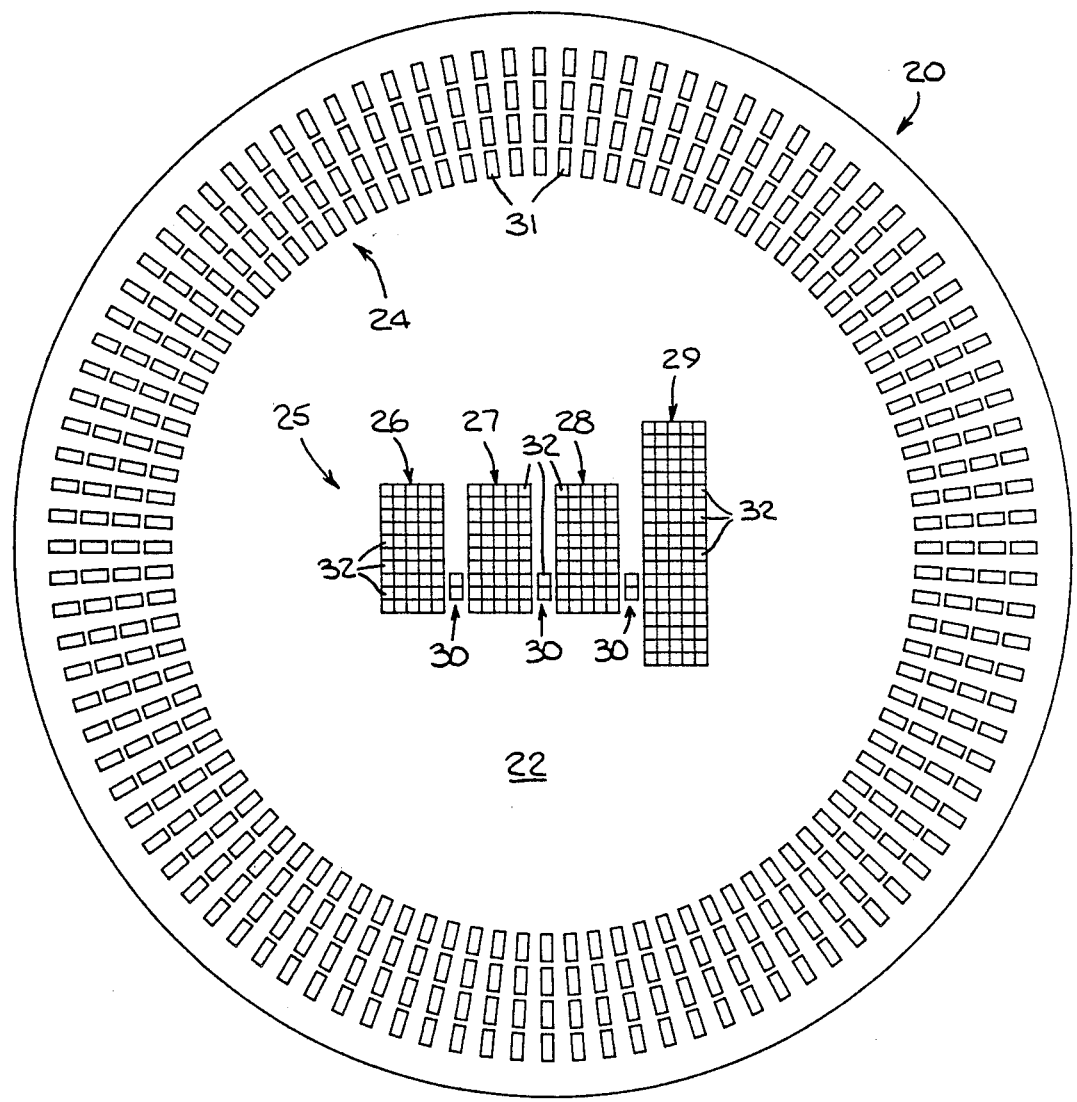
FIG. 1 is a front view of an unenergized display device of a display according to the present invention having a digital display portion and an analog display portion.

Referring to FIG. 1 of the drawings, display device 20 includes a face 22 having an analog display portion 24 and a digital display portion 25. Digital display portion 25 includes digital display areas 26, 27, 28, 29 and 30. Analog and digital display portions 24 and 25 may be formed by individual matrix arrays or a composite matrix array of light-emitting diodes (LEDs) 31, 32, respectively. In the preferred embodiment, a composite matrix array is provided, as depicted in FIG. 9. A 5×10 diode portion of the matrix array defines each of digital display areas 26, 27 and 28. A 5×19 diode portion of the matrix array defines display area 29, and two closely spaced LEDs 32 define smaller display areas 30.

Figure 4:
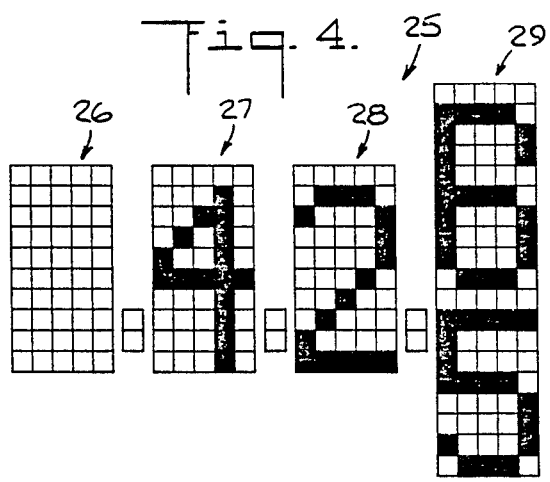
FIG. 4 is a diagram illustrating the digital display areas of the display device of FIG. 2 energized to display the value of the input signal parameter as it approaches "426"
Figure 5:
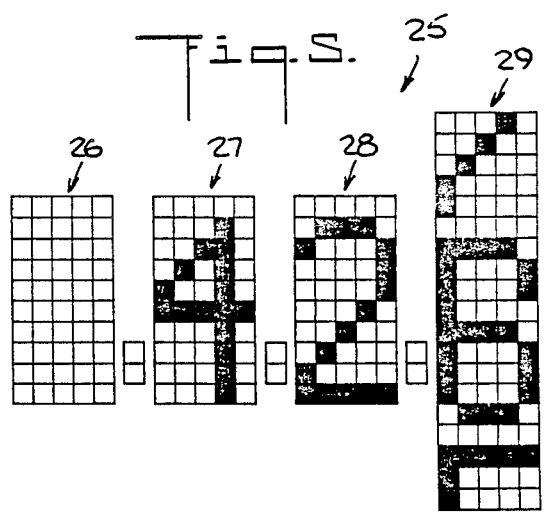
FIG. 5 is a diagram similar to that of FIG. 4 depicting the display areas energized to display the value of the input signal parameter as it starts to change from "426" to "427"

Digital display area 29 is made larger than digital display areas 26–28 in order to scroll the least significant digit of the parameter value being displayed while displaying either one full digit value and parts of two adjacent digit values as depicted, for example, in FIG. 5, or two full digit values as depicted, for example, in FIG. 4. LED's 32 in smaller display areas 30 disposed between digital display areas 26 and 27, between areas 27 and 28, and between areas 28 and 29 are arranged, for example, to display a decimal point. The remaining areas of display face 22 are passive, i.e., they are not intended to display variable indicia, and may be formed simply by a surface bearing fixed indicia compatible with the parameter to be displayed. LEDs 31 disposed in analog display portion 24 are arranged in a number (e.g., 100) of radially-extending lines, four LEDs 31 to a line, in an outer annular region of the display face. LEDs 31 forming each line in analog display portion 24 are energized together so that each line is either fully illuminated or fully off. LEDs 32 in digital display areas 26, 27, 28, 29 and 30 are each individually addressable so each individually may be selectively energized.

Figure 2:
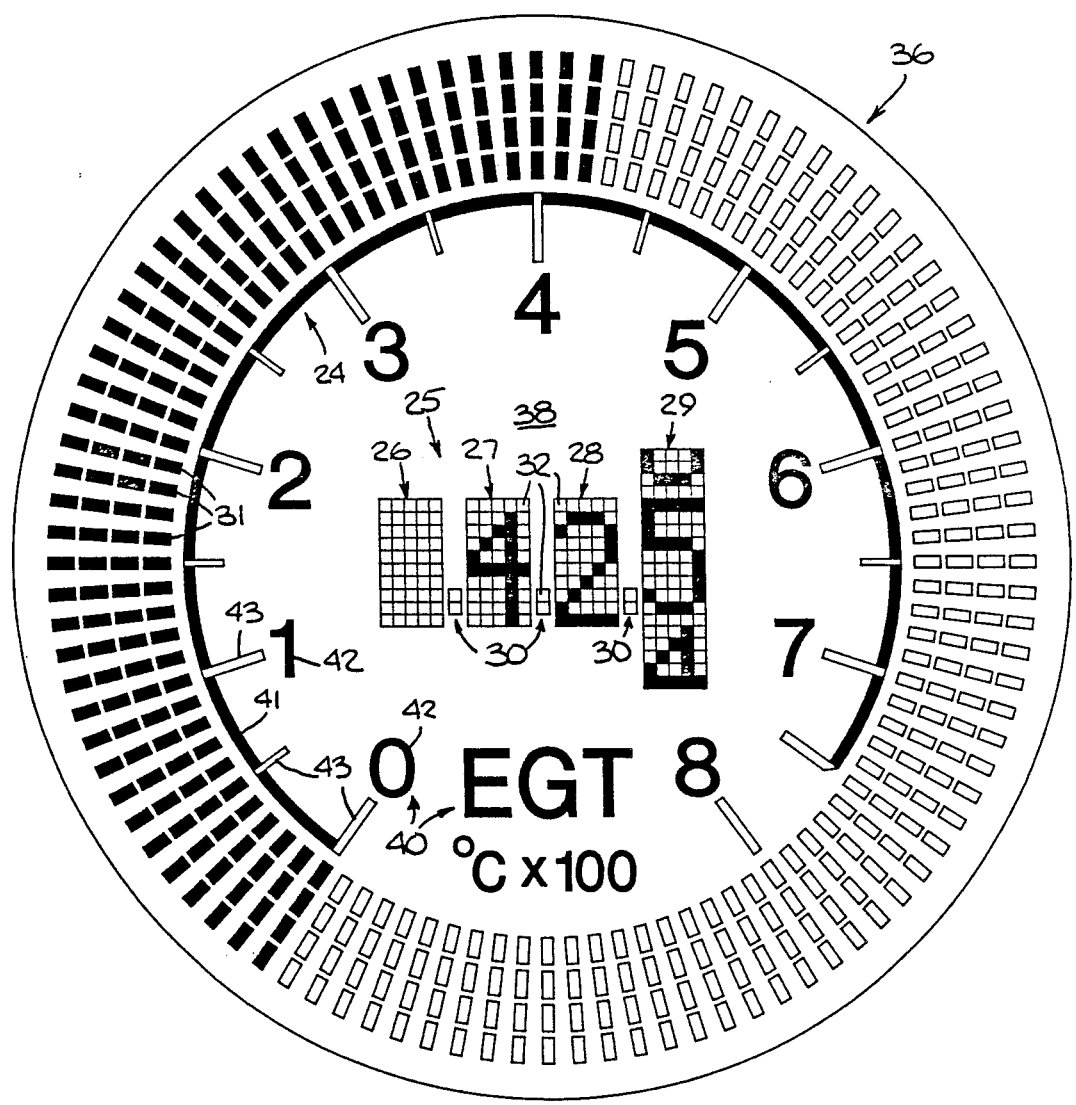
FIG. 2 is a front view of a display device of a display according to the present invention for indicating aircraft exhaust gas temperature, the display device including a digital display portion and an analog bar graph display portion, and being energized to indicate an input signal parameter value corresponding to an exhaust gas temperature of about 425° C. as the input signal parameter is varying.

Referring now to FIG. 2, an aircraft exhaust gas temperature (EGT) indicator display device 36 utilizing display device 22 of FIG. 1 is depicted. Display device 36 includes a display face 38 having analog display portion 24 and a digital display portion 25 including display areas 26–30, and in addition, includes indicia referenced generally by 40 corresponding to that of an EGT indicator. Specifically, indicia 40 includes a ring 41, and associated numbers 42 and cross marks 43 which form a circular meter scale. All or parts of indicia 40 may be illuminatable. EGT indicator display device 36 as depicted in FIG. 2 is energized (darkened LEDs are energized) to digitally display an exhaust gas temperature of approximately 425° C. (°C. ×100 referring only to numbers 40 in analog display portion 24) with the least significant digit being scrolled in the larger display area 29 while the EGT value is still changing. Thus, digital display area 29 displays the "5" digit value completely, and parts of the "4" and "6" digit values as the value of the least significant digit is scrolled.

Figure 2A:
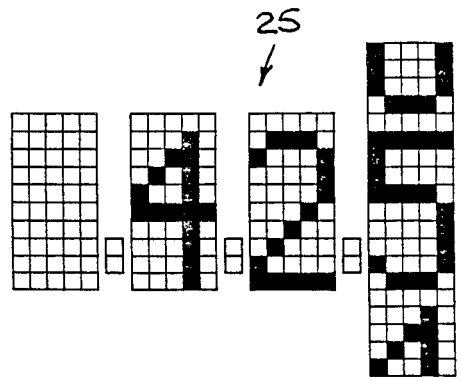
FIG. 2A is a front view of the digital display portion of the display device of FIG. 2 energized to display the value "425" after the input signal variable having the value depicted in FIG. 2 has stopped varying and the least significant digit rounded off.

In accordance with the rounding off feature of the invention, after the input signal parameter stops varying, the value of the least significant digit is rounded-off to 425. As depicted in FIG. 2A, after rounding off, the rounded off value "5" of the least significant digit is displayed centered in larger display area 29 horizontally aligned with the more significant digit values "2" and "4" in the more significant digit display areas 28 and 27, respectively. In addition, parts of the adjacent less significant digit values "4" and "5" are respectively displayed below and above the centered, rounded-off least significant digit value "5".

In the embodiment of FIG. 2, EGT display device 36 also displays the EGT value in analog display portion 24 in the form of an analog bar graph. Illumination of all LEDs 31 in analog display area 24 from adjacent the "0" cross mark on ring 41 to slightly past the "4" cross mark on ring 41, i.e., one quarter the distance between the "4" and the "5" cross mark on ring 41, creates a bar graph or ribbon type analog display extending adjacent ring 41 which also indicates an EGT value of approximately 4.20° C.×100, which approximately corresponds with the digitally displayed value of 425° C.

Figure 3:
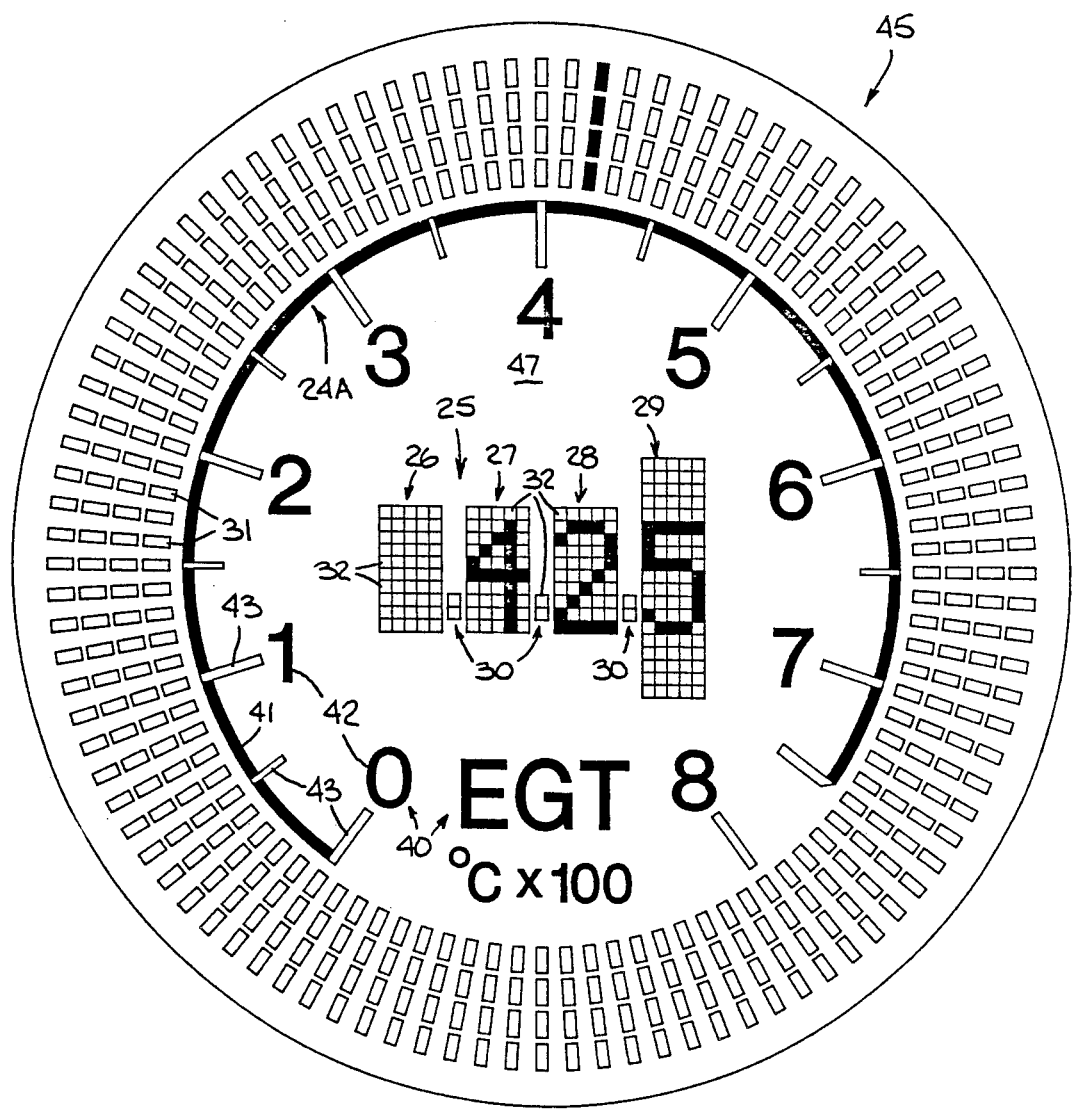
FIG. 3 is a front view of a display device of a display according to another embodiment of the invention for indicating aircraft exhaust gas temperature, the display device including a digital display portion and an analog pointer display portion and being energized to indicate an input signal parameter value of 425° C. after the input signal having the parameter value displayed in FIG. 2 has stopped varying and the least significant/digit rounded off.

Referring to FIG. 3, display device 45 is another embodiment of an EGT indicator. Display face 47 of device 45 is the same as display face 38 of device 36 in FIG. 2, i.e., analog and digital display portions 24 and 25 are formed as described for device 36 of FIG. 2, but device 47 is operated differently to provide an analog display which differs from that of device 36. Specifically, analog display portion 24A of device 45 operates as a pointer simulating a meter movement as opposed to the bar graph analog display of device 36. The pointer is created in analog display portion 24A of display device 45 by energizing the four LEDs of only one line at any one time. Thus, a line of four energized LEDs 31 functions as a pointer to indicate the analog value on ring 41 corresponding to the digital value displayed in digital display areas 26–29.

Display device 45 as depicted in FIG. 3 is energized to display the digital value "425" after the value of the input variable has stopped changing from the value depicted in display device 36 in FIG. 2, and the value of the least significant digit is rounded off. In accordance with an alternate embodiment of the rounding off feature of the invention, only the rounded-off least significant digit value "5" is displayed in display area 29 centered and horizontally aligned with the more significant digits in display areas 26–28, and no other digit values are displayed in display area 29 adjacent the "5" value.

In another embodiment, display area 29 is made the same size as display areas 26–28. With the input signal parameter changing and the least significant digit being scrolled, either a full digit value or parts of two digit values are displayed in the display area of the least significant digit. After rounding off, only the rounded-off value is displayed in the display area of the least significant digit in horizontal alignment with the display of the more significant digits.

FIGS. 2, 4 and 5 illustrate scrolling of the displayed value of the input signal variable as it changes from approximately "425" towards "427". In FIG. 2, the displayed parameter value is approximately "425" as it is changing from "425" to "426", with the least significant digit being scrolled by displaying the "5" digit and portions of the "4" and "6" digits in larger display area 29 below and above the "5" digit, respectively. In FIG. 4, the displayed value has moved closer to "426" so that the digits "5" and "6" are both fully visible in larger display area 29. In FIG. 5, the input variable has increased still further so that the displayed value is advancing towards "427", and larger display area 29 displays the entire digit "6" and portions of adjacent digits "5" and "7". If the input variable stopped changing at the point depicted in FIG. 5, it would be rounded off to "426" and displayed with the "6" centered in area 29 aligned with the "4" and the "2" in areas 27 and 28, respectively. During scrolling of the least significant digit in FIGS. 2, 4 and 5, the display of the more significant digit in areas 27 and 28 remains stationary.

Figure 6:
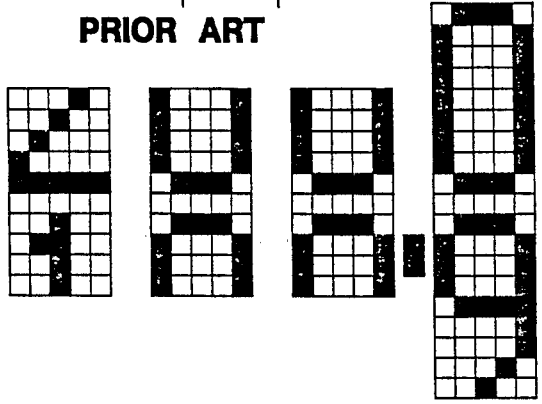
FIG. 6 is a diagram illustrating the display area of a prior art digital display energized to display a parameter value as it is changing from 199.9 to 200.0.

FIG. 6 depicts a prior art display in which the more significant digits ar scrolled in synchronism with scrolling of an adjacent less significant digit. Thus, a number of digits may synchronously scroll between their highest and lowest values such that there will be a number of digits in transition, making the displayed value difficult to read. For example, when the displayed value changes between "199.9" and "200.0," as depicted in FIG. 6, there is an uncertainty in the reading.

Figure 7:
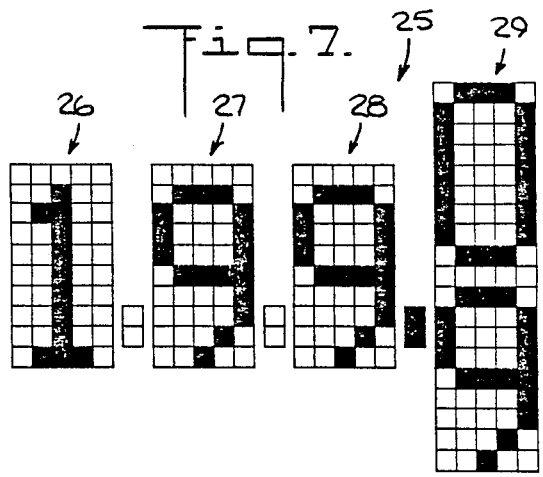
FIG. 7 is a diagram illustrating the digital display areas of the display device of FIG. 1 energized to display a parameter valve as it is changing from "199.9" to "200.0"
Figure 4:
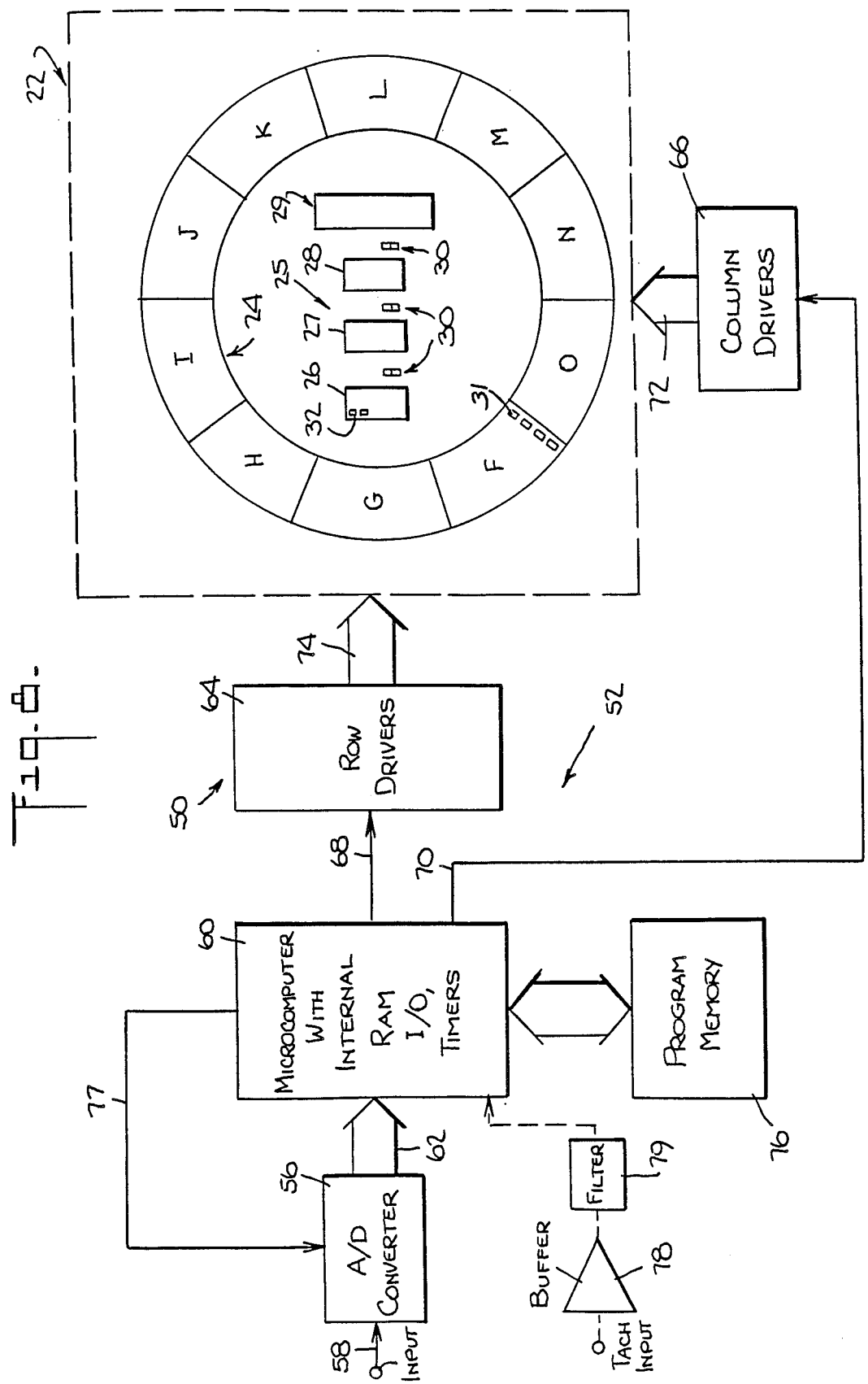

Referring to FIG. 7, in accordance with a feature of the invention, all of the more significant digits (display areas 26–28) remain stationery as the least significant digit (display area 29) is scrolled, and when the least significant digit comes within a predetermined range of its highest or lowest value, then the adjacent more significant digit changes instantaneously. For example, with larger display area 29 indicating tenths and the input variable changing between "199.9" and "200.0", when the value of the input variable is greater than "199.95", then the more significant digits in display areas 26–will change instantaneously from "199" to "200".

FIG. 8 depicts a display system 50 according to the invention including display device 22 of FIG. 1 and energizing means 52. LEDs 31 and 32 are arranged in display device 22 as described in connection with FIG. 1. Accordingly, LEDs 31 are arranged in analog display portion 24 and LEDs 32 are arranged in digital display areas 26–30, as described for FIG. 1. Regions designated "F" through "O" in analog display portion 24 in FIG. 8 each correspond to ten rows of interconnected LEDs 31 in FIG. 1.

Energizing means 52 (FIG. 8) includes an analog to digital (A/D) converter 56 which receives the input signal on line 58, a microcomputer 60 which receives the output of A/D converter 56 on lines 62, and row drivers 64 and column drivers 66 which receive digital information from microcomputer 60 on lines 68 and 70, respectively, and in response thereto supply signals to display device 22 on lines 72 and 74, respectively, to selectively energize LEDs 31 and 32 in the analog and digital display portions. Microcomputer 60 receives digital data on lines 62, processes it and outputs it on lines 68 and 70 in accordance with the program stored in program memory 76. Microcomputer 60 is also coupled to A/D converter 56 by line 77 to synchronize reading thereof.

A/D converter 56 is provided to convert an EGT analog signal into digital form so it can be processed by microcomputer 60. A/D converter 56 may convert other analog signals to digital form, and other signals may be supplied to microcomputer 60 for processing and display. For example, a tachometer signal may be supplied to microcomputer 60 via buffer 78 and filter 79, and display device 22 may indicate engine speed.

Referring to FIG. 9, analog display portion 24 and digital display areas 26–30 are formed by a composite LED matrix array 80 composed of rows and columns. Matrix array 80 includes ten rows designated rows "0" through "9", and 56 columns designated columns "1" through "56", of which 38 columns are utilized. Each row of LEDs in analog display area 24 is assigned both a letter ("F" through "O") and numbers ("9-0", "19-10", ... "99-90"). The LEDs depicted in FIG. 9 correspond to these in FIG. 2 as follows. The ten LEDs 9-0 in row F of FIG. 9 correspond to the ten rows of LEDs 31 in FIG. 2 between "0" and "1" on ring 41. Similarly, LEDs 19-10 in row G correspond to the ten rows of LEDs 31 in FIG. 2 between "1" and "2" on ring 41, etc. The portions of matrix array 80 in FIG. 9 corresponding to the upper and lower halves of digital display area 29 FIG. 2 are designated "Upper Half" 29A and "Lower Half" 29B, respectively, and are disposed side by side in the array. The more significant digits in display areas 28, 27 and 26 in FIG. 2 correspond to the portions of matrix array 80 designated 28, 27 and 26, respectively, with display area 26 displaying the most significant digit. The small display areas 30 in FIG. 9 correspond to areas 30 in FIG. 2 for displaying the decimal point.

LED matrix array 80 is energized sequentially one row at a time with individual LEDs in that row being energized in accordance with the digital signal supplied to column drivers 66. EEDs in rows 0-9 are sequentially energized at a rate sufficiently high so that the display appears continuous to the human eye. For example, each row may be energized for approximately 1 ms in a 10 ms sequential refresh cycle, i.e., new data is provided for the display every 10 ms. FIG. 9 also depicts a 56-bit word supplied serially in 8 bit bytes by microcomputer 60 on line 70 to column drivers 66. Micro computer 60 supplies 8 bits of the 56 bits at 1 ms intervals. Although each row is energized for 1 ms of the 10 ms cycle, new data is not displayed until after the full 56 bit word has been received by column drivers 66. Column drivers 66 may include shift registers and latches. For example, two 32-bit serial in, parallel out, shift registers may be provided into which data is serially clocked 8 bits at a time (with 8 spaces being open bits). The parallel outputs of the shift registers may be coupled to latches, one for each column of matrix array 80, into which the 56 bit word in the shift registers is latched each 10 ms. Row drivers 64 may comprise a decade counter which is clocked each time a 56 bit serial word is latched, and then reset after the counter counts to 10, which indicates that the ten LED rows have been sequenced.

Figure 10:
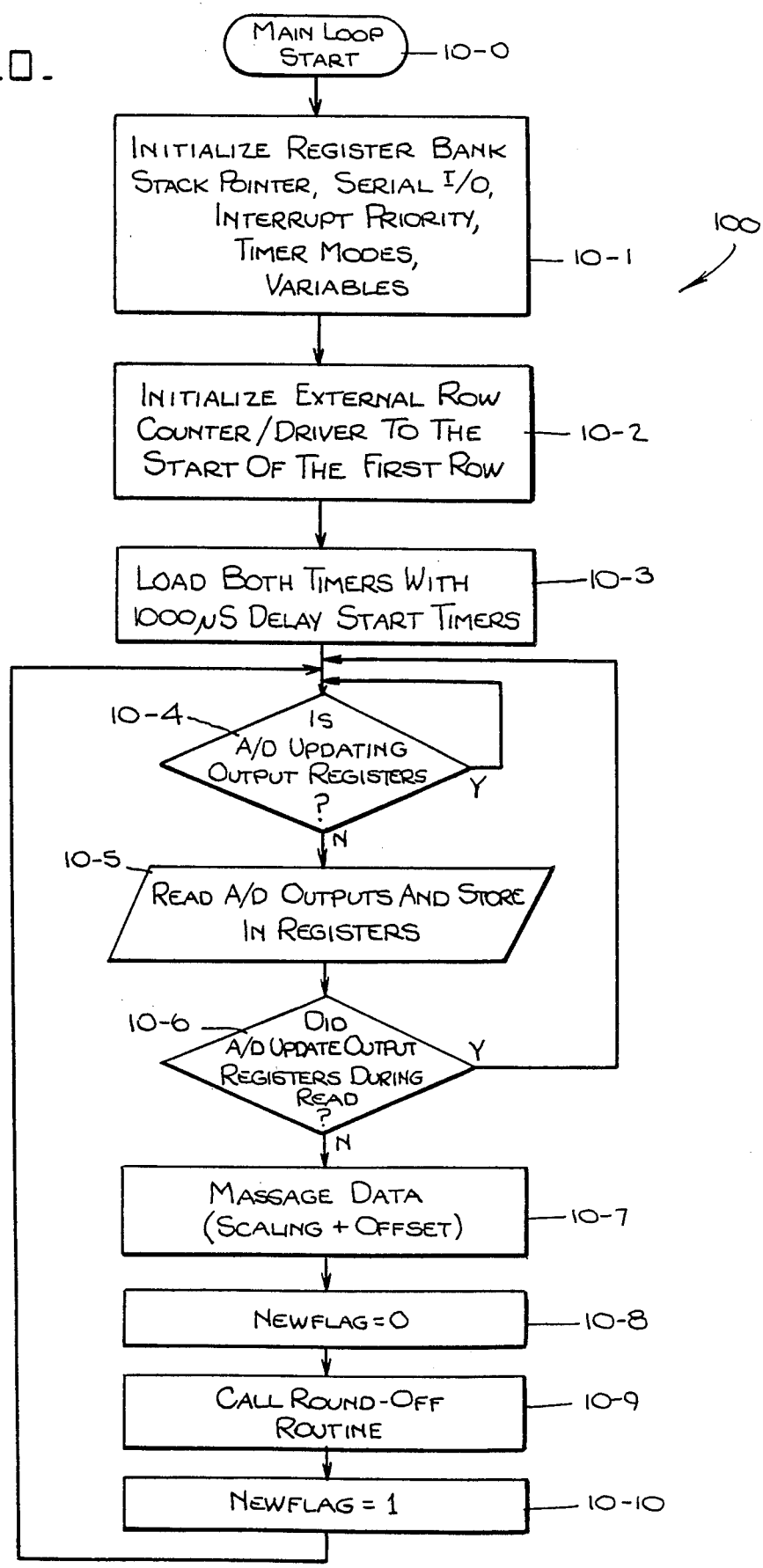
FIG. 10 is a flowchart depicting the program main operating loop of the display depicted in FIG. 8.

Referring to FIG. 10, program flowchart 100 defines operation of the system depicted in FIGS. 8 and 9. Flowchart 100 depicts the main operating loop of the system which also includes two interrupt routines, "Timer 1 Interrupt" defined by the flow chart depicted in FIG. 12 and "Timer 0 Interrupt" defined by the flow chart depicted in FIGS. 15A–15D.

Figure 11:
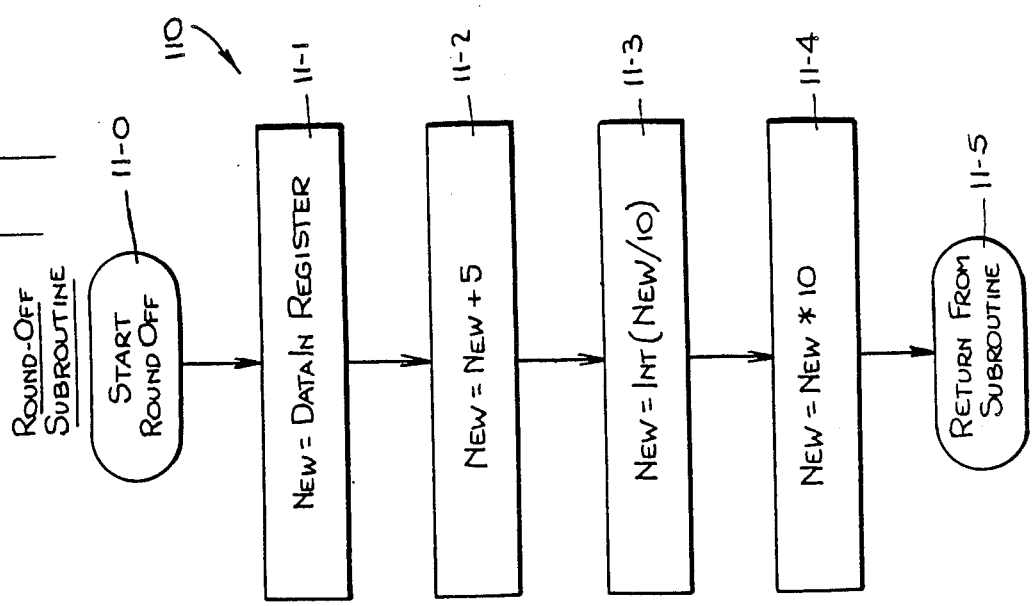
FIG. 11 is a flowchart of the "round-off subroutine" of the main operating loop of the flowchart of FIG. 10.

The main loop of the system program flow-charted in FIG. 10 proceeds as follows. Main loop start 10-0 is followed by internal initialization step 10-1, in which the internal register bank, stack pointer, serial input/output (I/O) ports, interrupt priority, timer modes and variables are initialized. In step 10-2, external initializing of row driver 64 (FIG. 8) is accomplished which resets the row driver to drive row "0". In step 10-3, the timers controlling the "Timer 1 Interrupt" and "Timer 0 Interrupt" routines are loaded with a 1000 μs delay and started. At the end of the 1000 μs count-out of the timers, the corresponding interrupt will be carried out, with "Timer 0 Interrupt" having priority over all other interrupts. Steps 10-4, 10-5 and 10-6 read the output of A/D converter 56 (FIG. 8). If the A/D converter updated its output during a read in step 10-4, the main loop waits until updating is completed before proceeding to step 10-5. In step 10-6, a determination is made of whether the stored A/D output read in step 10-5 was updated during reading thereof. If it was, then the main loop reverts to step 10-4 and re-reading takes place. Once the A/D reading is obtained in step 10-6, the data is conditioned in step 10-7, e.g., scaled, and a flag is cleared (NEWFLAG=0) which informs the system that the round-off subroutine is to be called in step 10-9. The round off subroutine 110, flowcharted in FIG. 11, is entered in step 11-0. In step 11-1, the massaged data (from step 10-7) is placed in the variable "NEW" register. In step 11-2, an offset of +5 is added to the "NEW" data as the first step in rounding off. The offset value of step 11-2 is then divided by 10 in step 11-3 and the last digit discarded to provide an integer ("INT") value. In step 11-4, the value obtained in step 11-3 is multiplied by 10 to provide the rounded-off value. Assume the data in step 11-1 corresponds to a value of 425.6 (stored as 4256), as depicted in FIG. 4. In step 11-2, after adding the offset, the value is 4261. In step 11-3, the value when divided by 10 is 426.1 and when the last digit is discarded becomes 426. In step 11-4, after multiplication by 10, the rounded off value becomes 4260, or 426.0 as displayed.

The round-off subroutine in step 11-5 then returns to the main operating loop where it is re-entered in step 10-10, and NEWFLAG is set informing the "Timer 1 Interrupt" (FIG. 12) that new data is available for processing.

Figure 12:
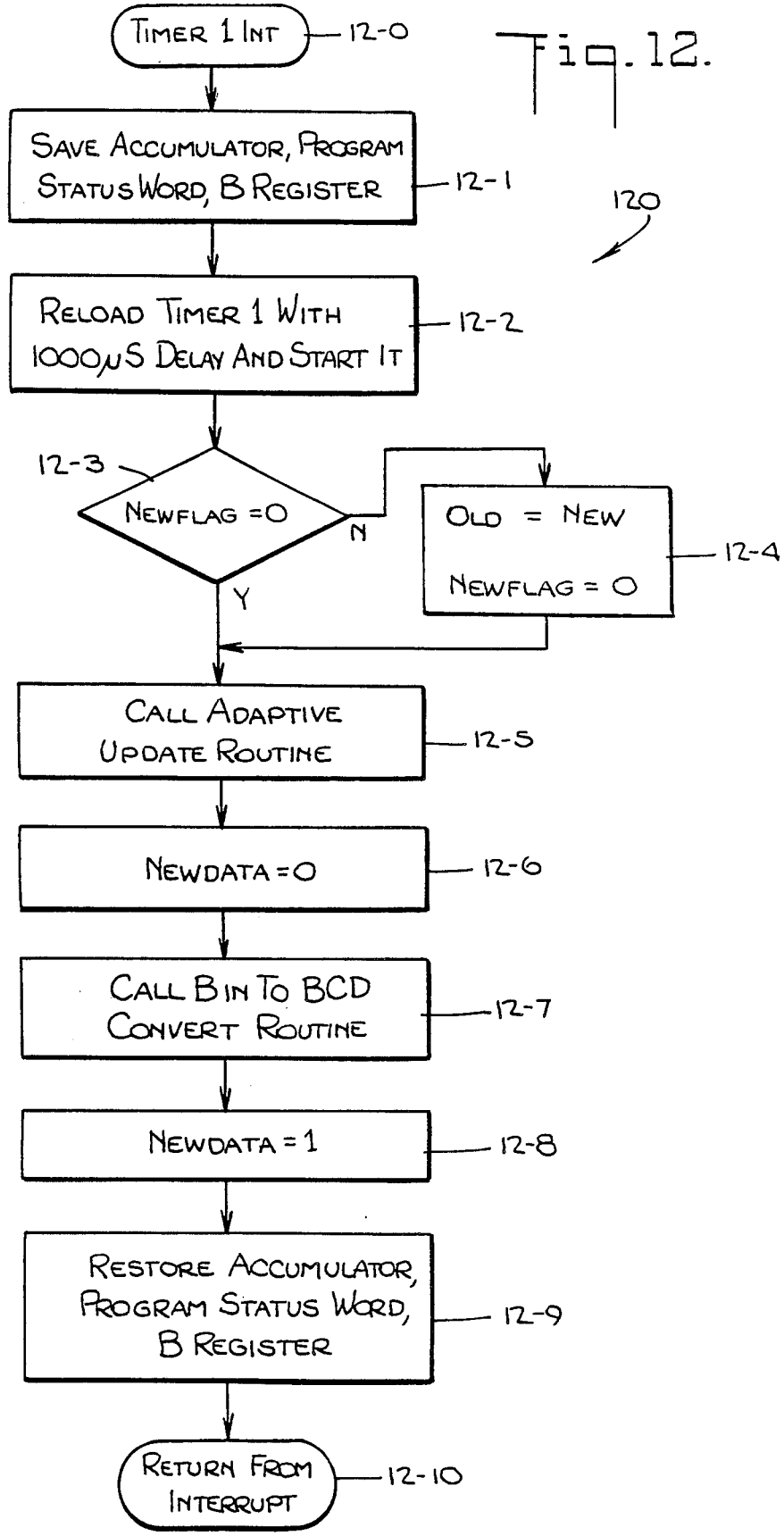
FIG. 12 is a flowchart of the "Timer 1 Interrupt" to the program main operating loop depicted in the flow chart of FIG. 10 for updating data to be supplied to the LED matrix array.

Referring now to FIG. 12, which depicts the program flowchart of the "Timer 1 Interrupt" routine 120, that routine is entered in step 12-0 upon count-out of the 1000 μs delay loaded into a timer ("Timer 1") within microcomputer 60. In step 12-1, the accumulator, program status word and B register information in microcomputer 60 at the time that the main loop transferred to the "Timer 1 Interrupt" are saved. In step 12-2, Timer 1 is reloaded with a 1000 μs delay and restarted. In step 12-3, the status of the NEW FLAG is checked. If NEW FLAG does not equal 0, which means that NEW FLAG=1 and that data supplied by the A/D converter 56 has been updated, then step 12-4 is carried out before the routine proceeds to step 12-5. In step 12-4 old data variable "OLD" is replaced by the data held in the variable "NEW" register and the NEW FLAG is cleared once again.

Figure 13:
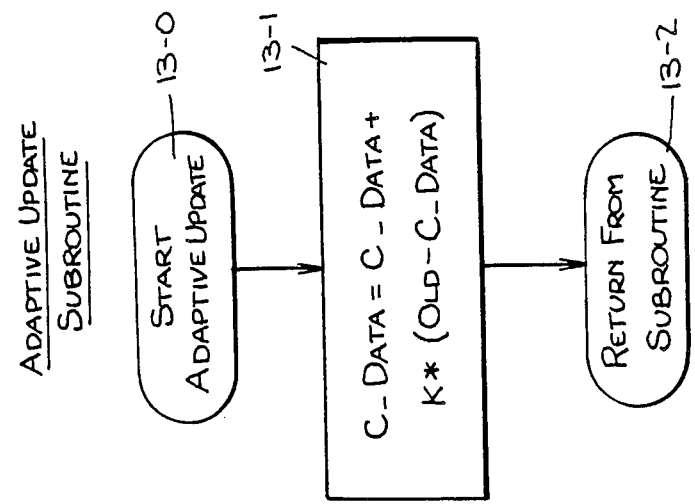
FIG. 13 is a flowchart depicting the adaptive update subroutine of the "Timer 1 Interrupt" of the flowchart of FIG. 12.

In step 12-5, the adaptive update routine illustrated by the flowchart in FIG. 13 is called up. The purpose of the adaptive update routine is to slowly increment or decrement the value to be displayed as the value changes from a previous A/D converter reading to a new A/D converter reading indicative of the new value to be displayed. In so doing, rather than instantaneously changing the old displayed value to its ne one, the displayed value is gradually changed towards the new value so that the trend towards the new value may be discerned, similar to the manner in which a mechanical counter counts from one value to the next. However, while the least significant digit is scrolled as described above, the more significant digits change instantaneously and are not scrolled.

Referring to FIG. 13, the adaptive update routine 130 is entered in step 13-0 and proceeds to step 13-1 where current data ("C_DATA") is made equal to current data plus a constant (K) times the quantity of (old data minus the current data). The response given by the equation in 13-1 represents an exponential curve which is followed in going from one value to be displayed to the next. After the adaptive update routine provides the current data in step 13-1, it proceeds to step 13-2 where the "Timer 1 Interrupt" routine is re-entered at step 12-6.

Figure 14:
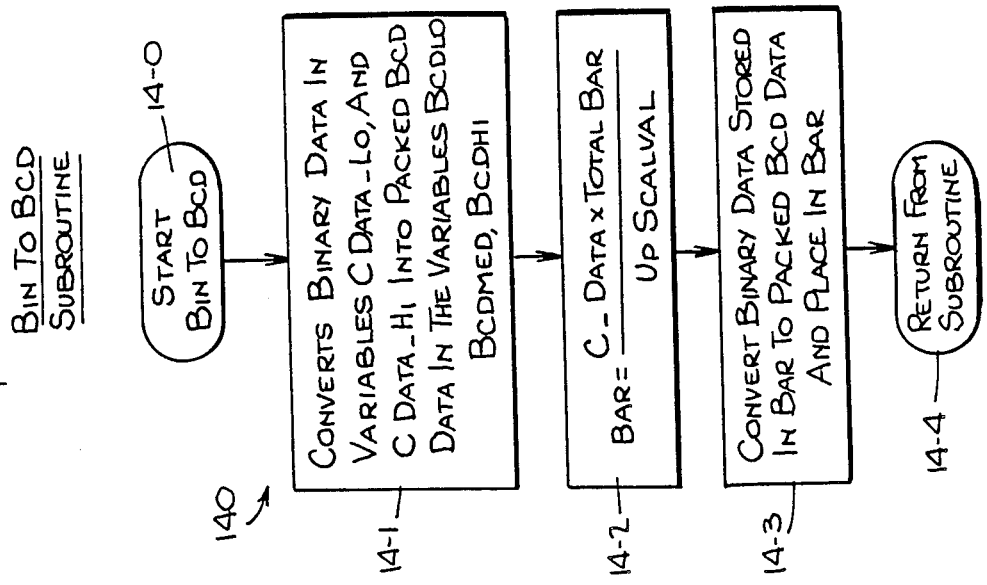
FIG. 14 is a flowchart illustrating the binary to binary coded decimal conversion subroutine of the "Timer 1 Interrupt" of the flowchart of FIG. 12.

In step 12-6 of "Timer 1 Interrupt," the flag "NEW DATA" is cleared which informs other routines that the number to be displayed is changing from an old to a new number. In step 12-7, the binary to binary coded decimal ("BCD") routine 140 defined by flowchart 140 in FIG. 14 is called up. Referring to FIG. 14, that routine is entered in step 14-0. In step 14-1, binary data for the digital areas of the display is converted to binary coded decimal. Specifically, the binary data is arranged in 16 bit words of two bytes each, a "CDATA_LO" byte and a "CDATA HI" byte, which are packed into 24 bit binary coded decimal words "BCDLO," "BCEMED" and "BCDHI." The binary coded decimal words define the values to be displayed in display areas 26–29 as follows: "BCDLO" contains data for the upper and lower halves 29A, 29B of least significant digit display area 29; "BCDMED" contains data for more significant digit display areas 27 and 28, and 8 bits of "BCDHI" contain data for most significant digit display area 26. In steps 15-2 and 14-3, binary coded decimal data is obtained for analog display portion 24. In step 14-2, the length of the analog bar (energized LEDs 31 in analog portion 24 of FIG. 2) is determined by the formula: bar=current data ("C_DATA") times the present length of the bar ("TOTAL BAR") (80 bars) divided by the full scale value of the bars ("UPSCALVAL") (800 bars). That bar data is then converted to binary coded decimal form in step 14-3. In step 14-4, "Timer 1 Interrupt" routine 120 is re entered at step 12-8 thereof (FIG. 12), where the NEW DATA flag is set to 1 to inform other routines that the BCD data has been entered and may be used. In step 12-9 of the "Timer 1 Interrupt" routine, the accumulator, program status word and the B register of the main loop are restored and the main loop (FIG. 10) is re-entered in the same place at which it was interrupted.

Figure 15A:
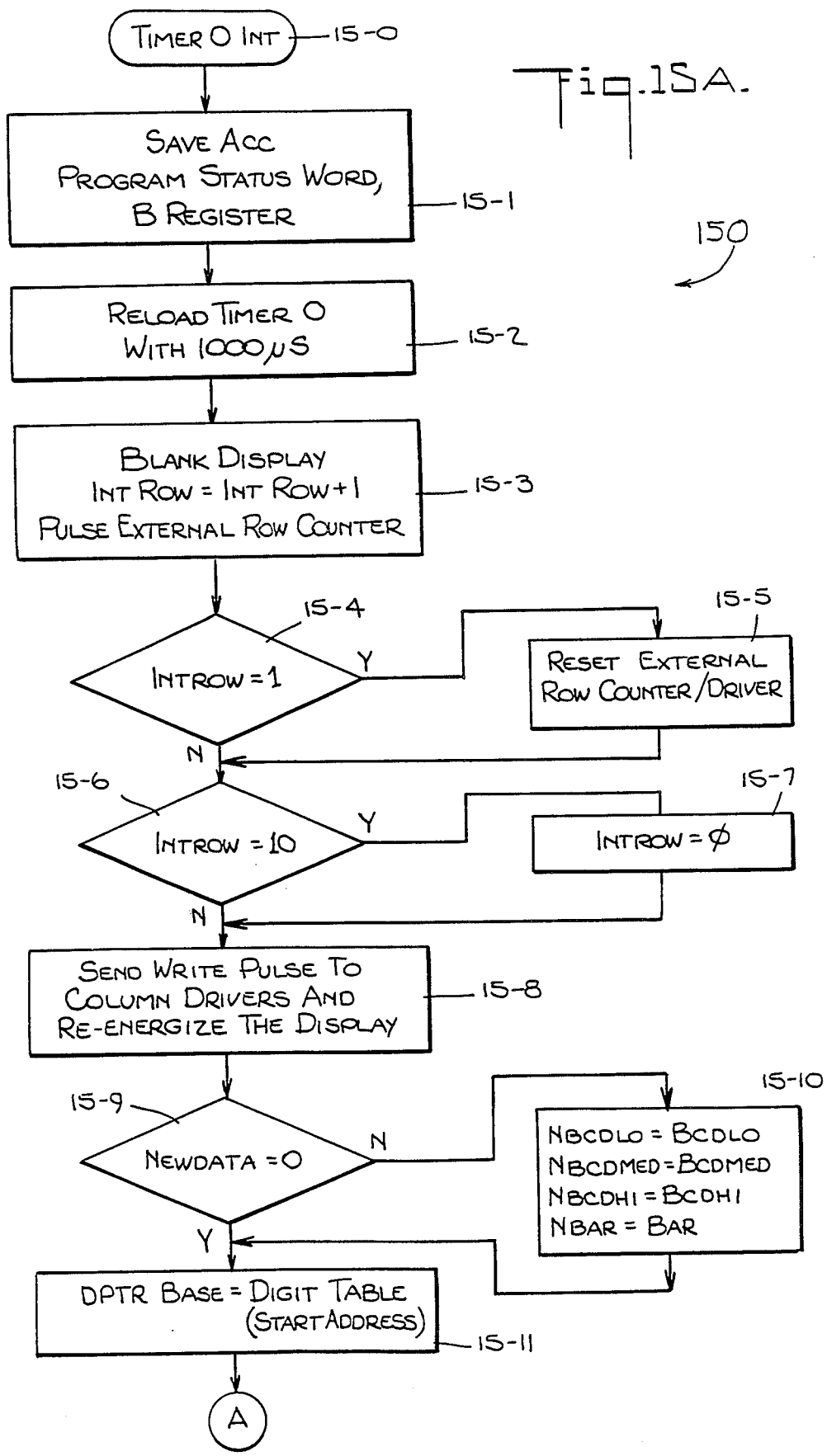
FIGS. 15A–15E taken together depict a flowchart of the "Timer 0 Interrupt" to the main operating loop depicted in the flowchart of FIG. 10 for processing input data.

Referring to FIG. 15A, the "Timer 0 Interrupt" routine 150 is entered in step 15-0 when "Timer 0", an internal timer in microcomputer 60, counts out. In step 15-1, the accumulator, program status word and B register information at the time that the main loop is interrupted is stored, and in step 15-2, Timer 0, is reloaded with a 1000 μs delay. In step 15-3, the LED matrix array 80 is blanked, a row counter in microcomputer 60 ("INTROW") is incremented, and an external row counter in row drivers 64 is incremented. In step 15-4, the internal row counter in microcomputer 60 is checked. If it is equal to 1, indicating that a new cycle (for energizing 0–9 of matrix array 80 in FIG. 9) has been started by microcomputer 60, then the external row counter in row drivers 64 is set to row 0. The status of the internal row counter is again checked in step 15-6 to determine whether or not it is 10, a 10 count indicating that sequencing of a nine-row cycle has been completed. This is necessary because the internal row counter is capable of counting past 9. If the internal row counter has a 10 count, then it is reset to 0 in step 15-7 to commence a new cycle. In step 15-8, a 56 bit word (see FIG. 9) previously serially output in 8 bit bytes on line 62 to column drivers 66 is latched into latches in row drivers 66 to energize the display in accordance with bit levels in the 56 bit serial digital word. The energizing data for LED matrix 80 is entered into registers in column drivers 66 one byte at a time during previous cycles and latched into the latches in a subsequent cycle which clears the registers to receive new data. This is accomplished by clocking of the external row counter. In step 15-9, the NEW DATA flag is checked to determine whether there has been a change in data processed by the "TIMER 1" sub routine. If there is no new data (NEW DATA=0), then the "Timer 0 Interrupt" routine proceeds to step 15-11. If there has been new data, then the new data is loaded in step 15-10 in BCD form according to the binary to BCD subroutine depicted in FIG. 14. In step 15-11, the memory table depicted in FIG. 16 which contains the bit information for energizing digital display areas 26–29 is entered.

Figure 16:
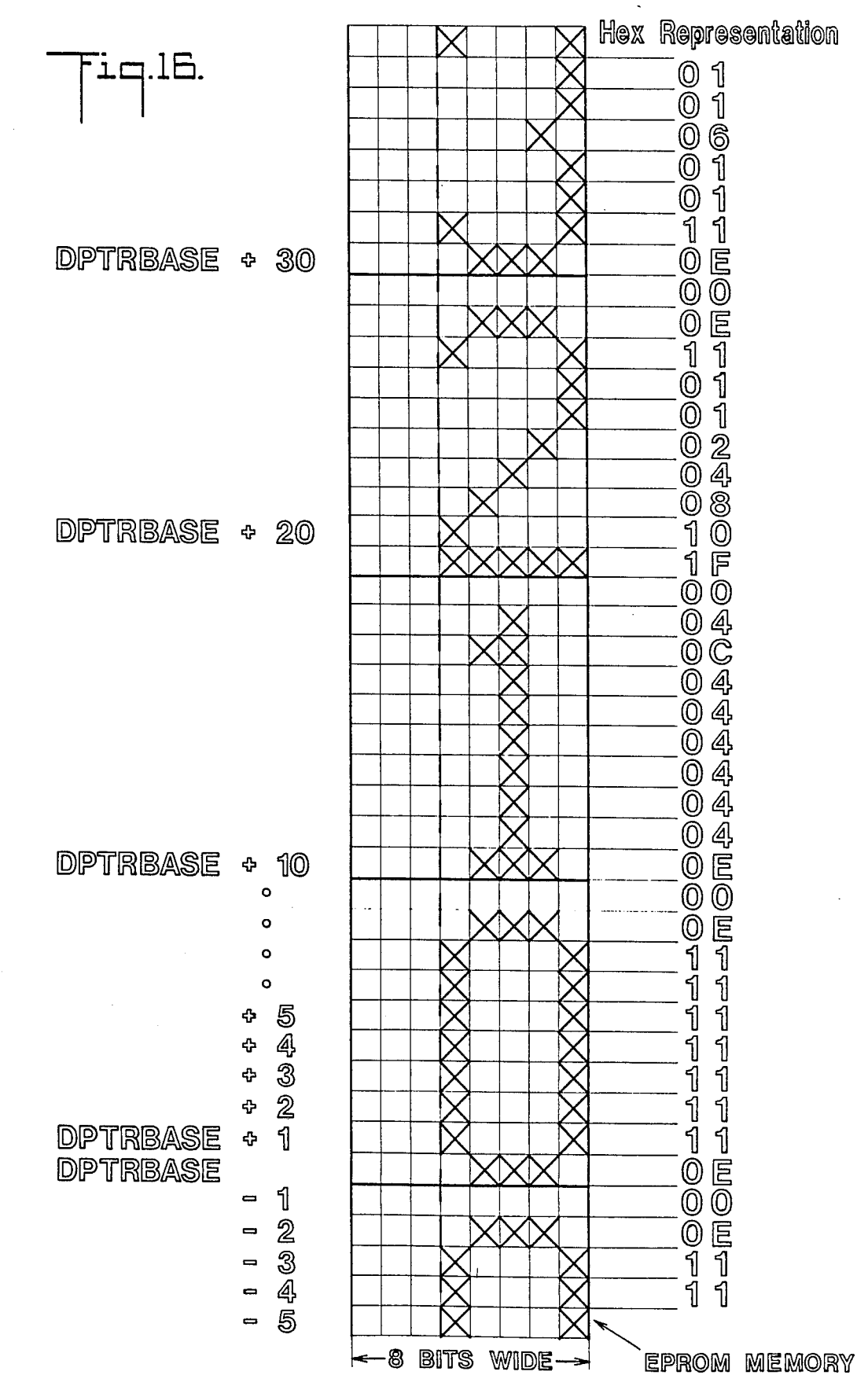

Referring next to FIG. 16, in order to display a digit in any of display areas 26–29, a reference is set in the memory table at the base of the number to be displayed, and then the reference is indexed to read out all of the row information necessary for reproducing the number. With respect to digital display area 29, either two complete digits or one complete digit and parts of two other digits are displayed, which requires that the table be read twice, once for the upper part and once for the lower part. The data pointer ("DPTR") base ("DPTRBASE") is the start address for entering the memory table in step 15-11 of FIG. 15A to obtain information for the digit value to be displayed in display area 29.

Figure 15B:
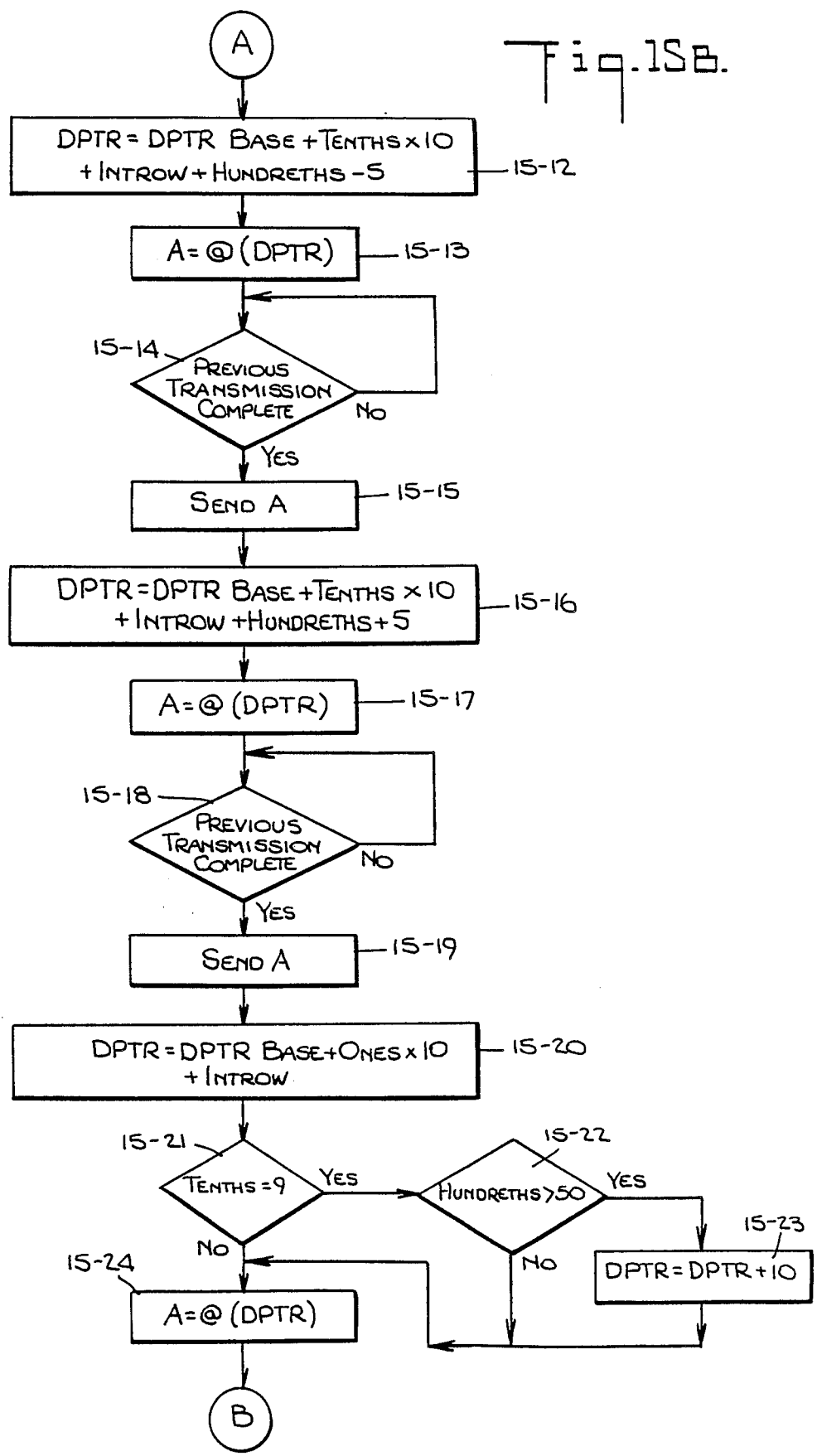
Figure 15C:
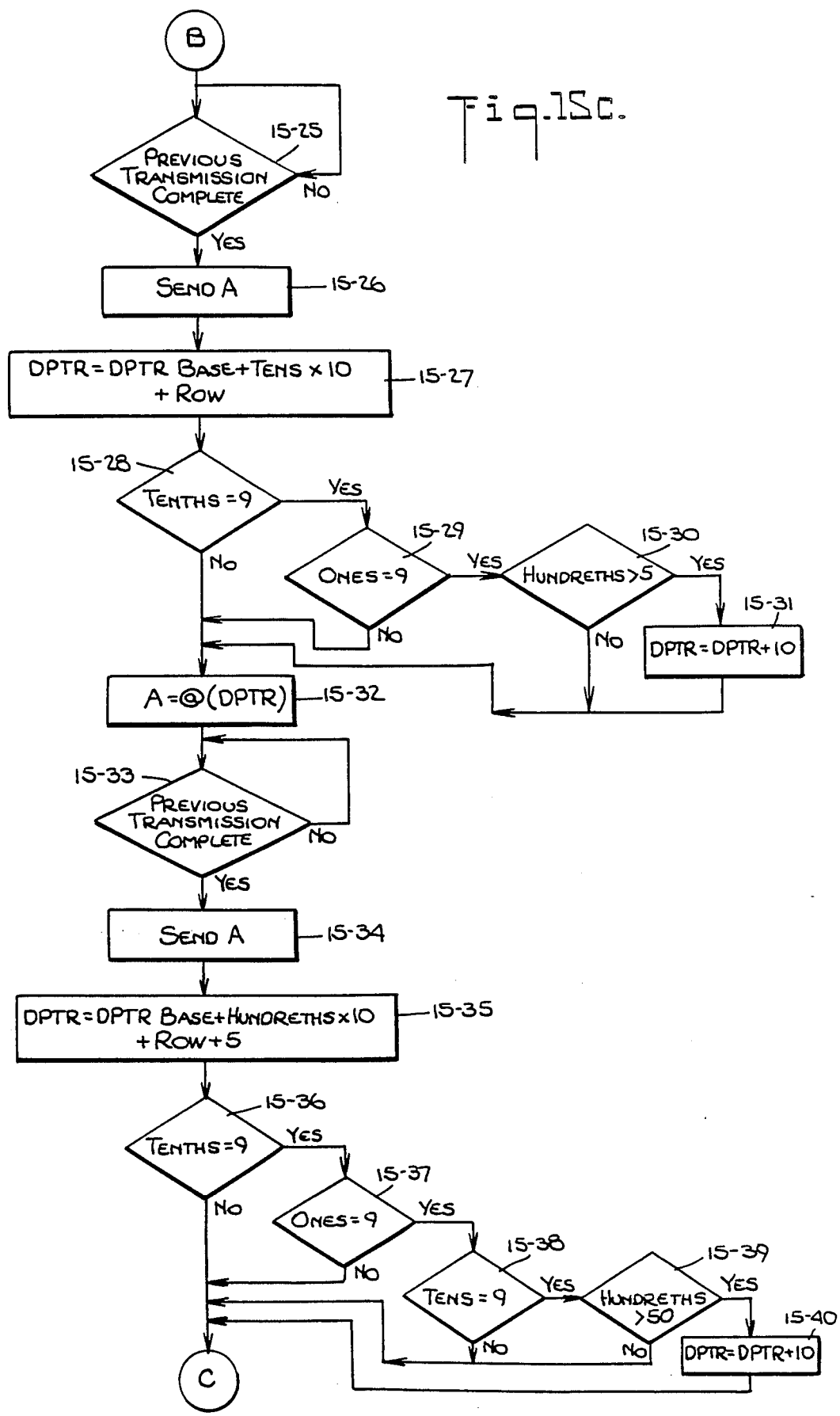
Figure 15D:
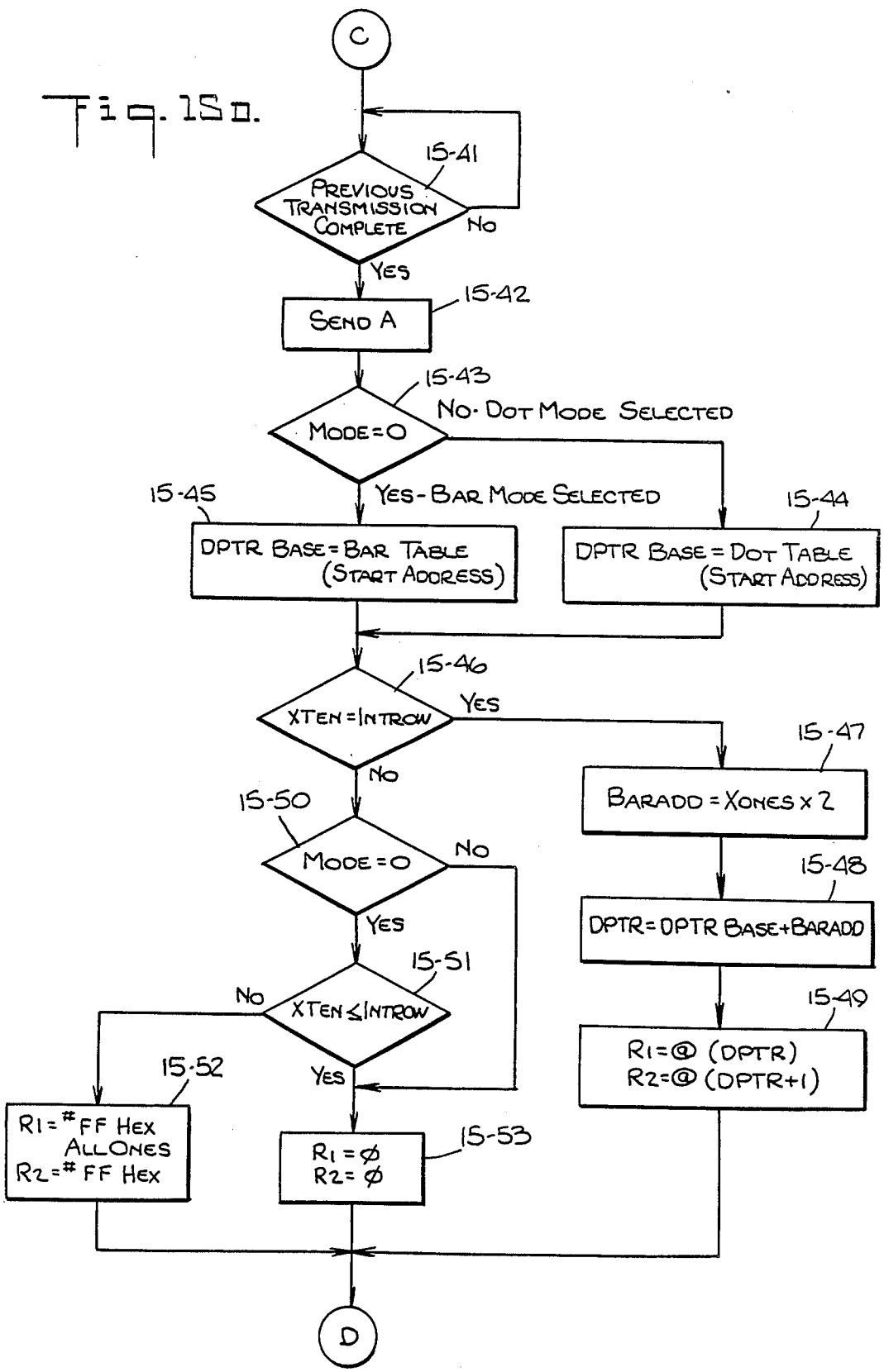
Figure 15E:
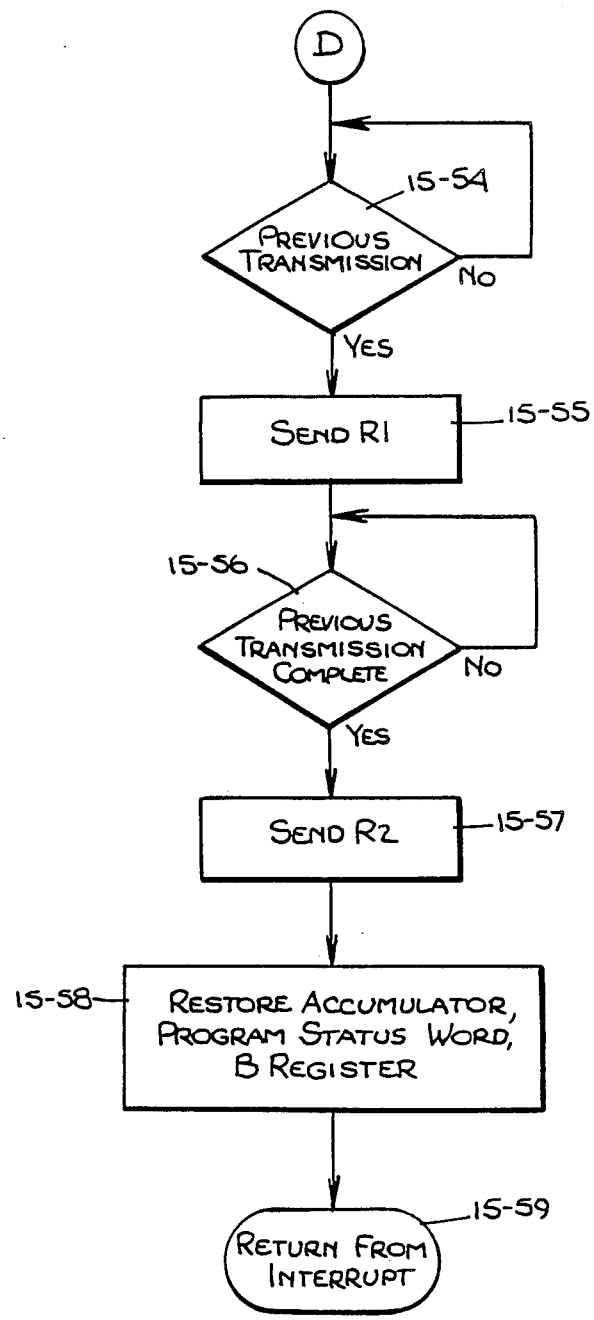

The "Timer 0 Interrupt" routine flow charted in FIGS. 15B–15D describes operation where the least significant digit displayed in display area 29 is tenths and the most significant digit displayed in display area 26 is hundreds. Referring to FIG. 15B, in step 15-12, the data pointer reference is determined by adding to the data pointer base the value of the tenths digit (the least significant digit) times 10 (to raise the data pointer to the appropriate block) plus the number of the internal row being processed (to select the particular LED locations in the digit table to be energized) plus an offset needed to displace the digit to be displayed to the lower portion 29B of display area 29. That information corresponding to the particular location of an LED or LEDs is loaded into internal register A of microcomputer 60 in step 15-13. In step 15-14, a check is made as to whether the previous transmission of data from microcomputer 60 has been completed. If it has not, the subroutine waits until it has been and then proceeds to step 15-15 where the contents of register A are output on line 70 in an 8 bit byte to column drivers 66. In steps 15-6 through 15-19, the routine is repeated for the upper portion 29A of display area 29 where the offset is plus 5.

The subroutine next proceeds to determine the information required to display the data in the remaining display areas 26–28. Information for displaying the value of the ones digit (display area 28) is determined in steps 15-20 through 15-24 and transmitted in steps 15-25 (FIG. 15C) and 15-26. The data base reference is determined in step 15-20 in a manner similar to that in step 15-12 except that it is determined for the ones digit and does not include an offset. In steps 15-21 through 15-23, a determination is made as to whether the ones digit is at a transition point. This is determined by checking the value of the tenths digit in step 15-21. If it is not equal to 9, then the digit is not at a transition point and the routine proceeds to step 15-24. If the ones digit is at a transition point, i.e., tenths equal 9 (step 15-21) and hundreds are greater than 50 (step 15-22), then the data pointer is offset by 10 ("DPTR+10") to display the next value of the ones digit. Data transmission occurs in steps 15-24 through 15-26 (FIG. 15C) as described for steps 15-13 through 15-15.

In steps 15-27 through 15-31 (FIG. 15C), information for displaying the tens unit (display area 27) is determined in manner similar to that for determination of the ones digit (display area 28) and transmitted in an 8-bit byte in steps 15-32 through 15-34. In steps 15-28 through 15-31, determination is made as to whether the ones and the tenths digits are at a transition point. In steps 15-35 through 15-42 the value of the hundreds digit (display area 26) is determined and transmitted. In steps 15-36 through 15-40 a determination is made as to whether the tenths, ones and tens digits are at a transition point.

Steps 15-43 through 15-56 (FIGS. 15C and 15D) provide the data for analog portion 24 of display 22. In step 15-43, a determination is made as to whether the display is in the dot (pointer mode) of FIG. 3 ("MODE≠0") or the bar mode of FIG. 2 ("MODE=0"). If the dot mode is selected, the routine proceeds to step 15-45 and enters a "dot" table lookup routine. If in the bar mode, the routine proceeds to step 15-45 where it enters a "bar" table lookup routine.

The LEDs 31 in analog display portion 24 are arranged in banks of ten (see FIG. 8) as is the data format for identifying the particular LEDs 31. For example, the seventh bank of 10 LEDs (bank "L" in FIG. 8) is identified by a "tens" value of 7, and individual LED rows in the seventh bank are specified by a "ones" value. Thus, a "tens" value of 7 and a "ones" value of 3 specifies the 73rd row, i.e., the 3rd row in LED bank "L". An internal counter in microcomputer 60 identifies the last LED bank specified. In step 15-46, the "tens" value of the analog value to be displayed is compared to the count of that internal counter. If they are the same, indicating that the analog value to be displayed is within the same bank as the last value computed, then the "ones" value ("BARADD") is determined in step 15-47. In step 15-48, a data table similar to the one depicted in FIG. 16 is entered at a data pointer ("DPTR") equal to a data pointer base ("DPTR BASE") represented by the "tens" value (the count of the internal counter) and an offset represented by the "ones" ("BARADD") value. In step 15-49, working registers R1 and R2 in microcomputer 60 are loaded with the data pointer value determined in step 15-48 and the data pointer value plus 1. In the bar mode, all LEDs up to the data pointer value contained in register R1 are energized and all LEDs beyond the data pointer value (DPTR+1) are not energized. In the dot mode, only the LEDs corresponding to the line value contained in register R1 are energized.

If in step 15-46 the tens value is not found to be equal to the internal row counter value, then the analog mode is again checked in step 15-50. If it is in the dot mode (Mode=0), then registers R1 and R2 are set equal to zero so that the LEDs corresponding to the particular value in the internal row counter will not be energized until a later cycle when the tens value equals the internal row counter value. If MODE=0 in step 15-50, then a determination is made in step 15-51 as to whether the tens value is less than or equal to the value of the internal row counter. If it is not, i.e., the tens value is greater than the value of the internal row counter, then registers R1 and R2 are set to all ones to specify that all LEDs up to the internal row counter value are to be energized. In step 15-46 of the next cycle, the flowchart will proceed to steps 15-47 through 15-49 and load registers R1 and R2 with the information necessary to energize all LEDs for displaying the proper analog value. If in step 15-51 the tens value is less than or equal to the internal row counter value, registers R1 and R2 are set to zero and energization of LEDs awaits a later cycle.

In steps 15-54 through 15-57, the data in working registers R1 and R2 is transmitted to column drivers 66 to specify which LEDs in the analog portion of the display are to be energized. Thereafter, in step 15-58, the accumulator, program status word and B register are restored to return the program to the location in the main loop at which the "Timer 0 Interrupt" took place, and the main loop is entered in step 15-59 at the point it was interrupted.

Certain changes and modifications of the embodiments of the invention disclosed herein will be readily apparent to those skilled in the art. For example, the display areas may be arranged in configurations other than the horizontal one illustrated in the drawings, e.g., in a vertical configuration in which the least significant digit moves horizontally. Also, configurations other than circular may be used for the analog bar graphic display and the meter scale/pointer display. Display areas 26–28 may be formed by display devices and elements other than LEDs which may change a displayed number instantaneously, and display area 29 may be formed by display devices and elements other than LEDs capable of moving a displayed digit, for example, electro-luminescence, liquid crystal, plasma gas discharge and vacuum fluorescence devices, to name a few. Also the size of the display areas may vary, and the relative size of display area 29 to the other display areas may vary. In addition, the digits may be displayed in different languages and different fonts may be used. The display disclosed herein is particularly suited for use as aircraft instruments, but may be used for other indicators and displays. It is the applicants' intention to cover by the claims all those changes and modifications which could be made to the embodiments of the invention herein chosen for the purpose of disclosure without departing from the spirit and scope of the invention.

What is claimed is:

1. A display device responsive to a received input signal for displaying a plural digit number representative of said received input signal, said display device comprising:

at least first and second display areas, each being energizable to display a discrete digit of the plural digit number;

said first display area displaying a less significant digit of the plural digit number and said second display area displaying a more significant digit of the plural digit number, the less and more significant digits being adjacent digits of the plural digit number; and energizing means responsive to an input signal for selectively energizing the display areas to cause the display areas together to display the plural digit number, the value of which is related to the received input signal;

the energizing means causing the display of the less significant digit in the first display are to scroll in accordance with changes in the received input signal and to instantaneously change the display of the more significant digit in the second display area when the less significant digit reaches a predetermined value relative to the highest and lowest values of the less significant digit;

the energizing means rounding off the value of the less significant digit of the plural digit number when the received input signal parameter is unchanging and causing the value of the less significant digit to be displayed in the first digital display area in alignment with the display of the more significant digit subsequent to rounding of the value of the less significant digit.

2. The display device according to claim 1 wherein at least the first display area of the display device comprises a matrix of energizable elements.

3. The display device according to claim 1 wherein the first and second display areas each area of approximately the same size, each being capable of fully displaying substantially only one value of a respective digit at a time.

4. The display device according to claim 1 wherein the first display area is energizable to fully display one value of the less significant digit of the plural digit number and at the same time adjacent thereto at least a part of a value adjacent to the one value of the less significant digit, or parts of two values adjacent to the one value of the less significant digit.

5. The display device according to claim 4 wherein the energizing means after rounding off the value of the less significant digit causes the rounded off value of the less significant digit to be fully displayed in the first display area in alignment with the display of the more significant digit and at the same time adjacent thereto to display in the first display area at least part of a value adjacent to the rounded-off value of the less significant digit.

6. The display device according to claim 4 wherein the energizing means after rounding off the value of the less significant digit causes only the rounded off value of the less significant digit to be displayed in the first display area in alignment with the display of the more significant digit.

7. The display device according to claim 1 wherein the first and second digital display areas are disposed side by side so as to display the two digits in a side-by side relationship.

8. The display device according to claim 1 including three or more display areas, the first display area displaying the least significant digit and the other display areas displaying the more significant digits of the plural digit number.

9. A display device for simultaneously displaying a plural digit number is digital and analog form comprising:
a display including a digital display portion and an analog display portion;
the digital display portion of the display including a plurality of display areas each being energizable to display a discrete digit of the plural digit number and having a first display area for displaying a less significant digit of the plural digit number and a second display area for displaying at least one more significant digit of the plural digit number, the less and more significant digits being adjacent digits of the plural digit number;
the analog display portion of the display device including a plurality of energizable display areas arranged in the form of an analog scale for indicating at least the more significant digit of the plural digit number; and
energizing means responsive to an input signal for selectively energizing the first and second digital display areas of the digital display portion of the display device to cause those display areas together to digitally display the plural digit number, the value of which is related to the received input signal;
the energizing means causing the display of the less significant digit in the first digital display to scroll in accordance with changes in the received input signal and to instantaneously change the display of the more significant digit in the second digital display area when the display of the less significant digit reaches a predetermined value relative to the highest and lowest values of the less significant digit;
the energizing means rounding off the value of the less significant digit of the plural digit number and causing the rounded-off value of the less significant digit to be displayed in the first digital display area in alignment with the display of the more significant digit when the input signal is unchanging;
the energizing means also selectively energizing the display area of the analog display portion to display an indicia on the scale corresponding to the digitally displayed plural digit number.

10. The display device according to claim 9 wherein the display area of the analog portion of the display is energizable to display a bar or ribbon, the length of which relative to the scale is related to the plural digit number digitally displayed in the digital portion of the display device.

11. The display device according to claim 9 wherein the display area of the analog portion of the display is energizable to display a discrete, generally pointer-like line, the location of which relative to the scale is related to the plural digit number digitally displayed in the digital portion of the display.

12. The display device according to claim 9 wherein at least the first digital display area of the display device comprises a matrix of energizable elements.

13. The display according to claim 9 wherein the first digital display area is energizable to display one value of the less significant digit of the plural digit number and at the same time adjacent thereto in said first display area at least a part of a value adjacent to the one value of the less significant digit, or parts of two values adjacent to the one value of the less significant digit.

14. The display device according to claim 13 wherein the energizing means after rounding off the value of the less significant digit causes the display to display in the first digital display area at least part of a value adjacent to the rounded off value of the less significant digit at the same time that the rounded-off value is displayed.

15. The display device according to claim 13 wherein the energizing means after rounding off the value of the less significant digit causes the display to display only the rounded-off value in the first display area.

16. The display device according to claim 9 wherein the first and second digital display areas are disposed side by side so as to display the two digits in a side-by-side relationship.

17. The display device according to claim 9 comprising three or more digital display areas, the first digital display area displaying the least significant digit and the other digital display areas displaying the more significant digits of the plural digit number.

18. A display device for simultaneously display a plural digit number representative of a received input signal in digital and analog form comprising:
a display including a digital display portion and an analog display portion;
the digital display portion of the display device including a plurality of display areas, each of the display areas being energizable to display a discrete digit of th plural digit number and having a first display area for displaying a less significant digit of the plural digit number and a second display area for displaying at least one more significant digit of the plural digit number, the first display area being larger than the second display area and being capable of fully displaying one digit value and at the same time at least part of an adjacent value, the less and more significant digits being adjacent digits of the plural digit number;
the analog display portion of the display device including a scale for indicating at least the more significant digit of the plural digit number and an energizable display area for specifying a value on the scale;

energizing means responsive to a received input signal for selectively energizing the digital display areas of the digital portion of the display device to cause those digital display areas together to digitally display the plural digit number, the value of which is related to the received input signal;

the energizing means causing the display of the less significant digit in the first digital display to scroll in accordance with changes in the input signal and to instantaneously change the display of the more significant digit in the second digital display area when the display reaches a predetermined value relative to the highest and lowest values of the less significant digit;

the energizing means rounding off the value of the less significant digit of the plural digit number when the received input signal parameter is unchanging and causing the value of the less significant digit to be displayed in the first digital display area in alignment with the display of the more significant digit subsequent to rounding off the value of the less significant digit;

the energizing means also selectively energizing the display area of the analog display portion to display an indicia on the scale corresponding to the digitally displayed plural digit number.

19. The display device according to claim 18 wherein the energizing means after rounding of the value of the less significant digit causes the display to display in the first display area at least part of a value adjacent to the rounded-off value of the less significant digit at the same time that the rounded-off value is displayed.

20. A method for displaying a plural digit number in a display device including a plurality of display areas, each of the display areas being energizable to display a discrete digit of the plural digit number, the method comprising:

selectively energizing the display areas in response to an input signal to cause the display areas together to display a value of the plural digit number related to an input signal;

scrolling the display of a less significant digit of the plural digit number in a first display areas in accordance with changes in the input signal and instantaneously changing the display of a more significant digit of the plural digit number in a second display area when the display of the less significant digit reaches a predetermined value relative to the highest and lowest values of the less significant digit, rounding off the value of the less signifcant digit of the plural digit number when the received input signal is unchanging; and displaying the rounded-off value of the less significant digit in the first display areas in alignment with the display of the more significant digit.

21. The method according to claim 20 wherein both the rounded-off value of the less significant digit and at least part of a digit having a value are simultaneously displayed when the input signal is unchanging.

22. The method according to claim 20 herein only the rounded-off value of the less significant digit is displayed in the first display area when the received input signal parameter is unchanging.

23. A display device for displaying a plural digit number in response to an input signal comprising:

a display including a plurality of display areas, each of the display areas being energizable to display a discrete digit of the plural digit number, said display including;

a first display area for displaying a less significant digit of the plural digit number and a second display area for displaying at least one more significant digit of the plural digit number, the less or more significant digits being adjacent digits of the plural digit number; and energizing means responsive to an input signal for selectively energizing the display areas to cause the display areas together to display the plural digit number related to the value of the input signal;

the energizing means causing the display of the less significant digit in the first display area to scroll in accordance with changes in the input signal;

the energizing means rounding off the value of the less significant digit of the plural digit number when the received input signal parameter is unchanging and causing the value of the less significant digit to be displayed in the first digital display area in alignment with the display of the more significant digit subsequent to rounding off the value of the less significant digit.

* * * * *